United States Patent
Chang et al.

(10) Patent No.: US 7,923,076 B2
(45) Date of Patent: Apr. 12, 2011

(54) PLASMA DEPOSITION APPARATUS AND DEPOSITION METHOD UTILIZING SAME

(75) Inventors: Chia-Chiang Chang, Taipei County (TW); Chin-Jyi Wu, Kaohsiung (TW); Shin-Chih Liaw, Hsinchu (TW); Chun-Hung Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 947 days.

(21) Appl. No.: 11/644,861

(22) Filed: Dec. 21, 2006

(65) Prior Publication Data
US 2008/0032063 A1    Feb. 7, 2008

(30) Foreign Application Priority Data
Aug. 7, 2006    (TW) .................................. 95128840

(51) Int. Cl.
H05H 1/24    (2006.01)
C23C 16/00    (2006.01)
(52) U.S. Cl. .................................... 427/569; 427/248.1
(58) Field of Classification Search .................. 427/569, 427/248.1
See application file for complete search history.

(56) References Cited

U.S. PATENT DOCUMENTS

| 5,256,205 A | 10/1993 | Schmitt, III et al. |
| 5,342,660 A * | 8/1994 | Cann et al. ..................... 427/577 |
| 5,356,672 A * | 10/1994 | Schmitt et al. ................ 427/446 |
| 6,659,110 B2 | 12/2003 | Fornsel et al. |

FOREIGN PATENT DOCUMENTS

| JP | 3089684 | 10/1992 |
| JP | 2002151436 A | 5/2002 |
| JP | 2005347278 A | 12/2005 |
| TW | 438899 B | 6/2001 |

OTHER PUBLICATIONS

China Patent Office, Office Action, Patent Application Serial No. 200610126347.6, Jan. 24, 2011, China.

* cited by examiner

*Primary Examiner* — Timothy H Meeks
*Assistant Examiner* — Kelly M Gambetta

(57) ABSTRACT

A plasma deposition apparatus is provided. The plasma deposition apparatus comprises a chamber. A pedestal is placed in the chamber. A plasma generator is placed in the chamber and over the pedestal. The plasma generator comprises a plasma jet for plasma thin film deposition having a discharge direction angle $\theta_1$ of 0° to 90° between a normal direction of the pedestal and the discharge direction of the plasma jet. A gas-extracting apparatus is placed in the chamber and over the pedestal. The gas-extracting apparatus comprises a gas-extracting pipe providing a pumping path for particles and side-products having a pumping direction angle $\theta_2$ of 0° to 90° between the normal direction of the pedestal and the pumping direction of the gas-extracting pipe.

9 Claims, 9 Drawing Sheets

Ra=0.6um

Ra=0.02um

PLASMA DEPOSITION APPARATUS AND DEPOSITION METHOD UTILIZING SAME

BACKGROUND OF THE INVENTION

1. Field of the Invention

The invention relates to a plasma deposition apparatus and deposition method utilizing same, and more particularly relates to an atmospheric plasma deposition apparatus and deposition method utilizing the apparatus.

2. Description of the Related Art

Deposition technology plays an important role in the current industrial processes. Thin film deposition can be executed by wet or dry deposition technology, high-quality thin film deposition, however, can only be executed by dry deposition technology. Conventional dry deposition technology comprises physical vapor deposition (PVD), chemical vapor deposition (CVD), atmospheric pressure CVD (APCVD), plasma-enhanced CVD (PECVD), metal organic CVD (MOCVD), molecular beam epitaxy (MBE), halide vapor phase epitaxy (HVPE) or evaporation. With the exception of APCVD (also called thermal CVD), the aforementioned dry deposition techniques require a vacuum environment. Atmospheric plasma-enhanced CVD (AP PECVD) has drawn considerable interest in the past as it does not require a vacuum environment. The term "atmospheric pressure" indicates that the required process pressure is about 760 torr or the same as environmental pressure. Conventional AP PECVD technology, however, does not achieve the flat film surface requirement, and often causes surface problems such as a hilly or pin-like surface. The described problems will affect film qualities such as transmittance, cleanliness or other surface characteristics. Tolerance for the described defects is greater when the conventional AP PECVD technology is used for lower film quality purposes such as civil industry. Conventional AP PECVD technology, however, can cause serious film problems in products with higher film quality requirements, such as optoelectronic semiconductor devices. A novel AP PECVD apparatus and a plasma thin film deposition method capable of solving the aforementioned process problems are thus desirable.

BRIEF SUMMARY OF INVENTION

A detailed description is given in the following embodiments with reference to the accompanying drawings.

A novel AP PECVD apparatus and a plasma thin film deposition method capable of eliminating particles and hilly or pin-like surface conditions are provided.

A plasma thin film deposition method with special plasma generator capable of solving the described process problems is also provided.

Some embodiments of a plasma deposition apparatus comprise a chamber. A pedestal is placed in the chamber. A plasma generator is placed in the chamber and over the pedestal. The plasma generator comprises a plasma jet for plasma thin film deposition having a discharge direction angle $\theta_1$ larger than 0° and less than 90° between a normal direction of the pedestal and the discharge direction of the plasma jet. A gas-extracting apparatus is placed in the chamber and over the pedestal. The gas-extracting apparatus comprises a gas-extracting pipe providing a path for and pumping particles and side-products at a pumping direction angle $\theta_2$ larger than 0° and less than 90° between the normal direction of the pedestal and the pumping direction of the gas-extracting pipe.

Some embodiments of a plasma thin film deposition method comprise: providing a substrate; generating a plasma for thin film deposition to form a thin film on the substrate using a plasma generator, wherein the plasma generator comprises a plasma jet having a discharge direction angle $\theta_1$ larger than 0° and less than 90° between a normal direction of the pedestal and the discharge direction of the plasma jet; pumping particles or side-products with a gas-extracting apparatus, wherein the gas-extracting apparatus comprises a gas-extracting pipe having a pumping direction angle $\theta_2$ larger than 0° and less than 90° between the normal direction of the pedestal and the pumping direction of the gas-extracting pipe.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
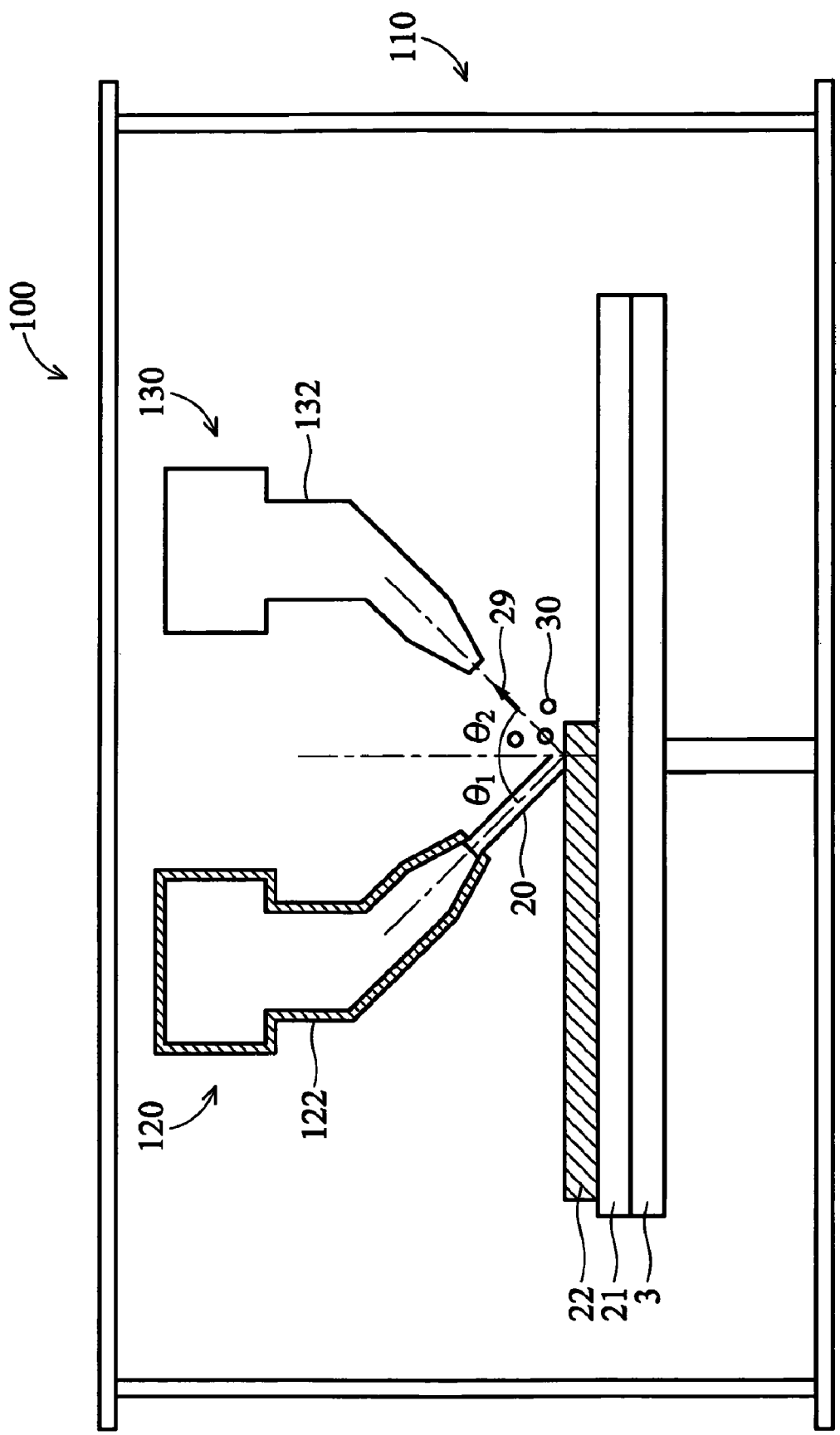
FIG. 1a is a cross section showing a first embodiment of a plasma deposition apparatus.

The following description is of the best-contemplated mode of carrying out the invention. This description is made for the purpose of illustrating the general principles of the invention and should not be taken in a limiting sense. The scope of the invention is best determined by reference to the appended claims.

FIGS. 1a to 1g show cross sections of various embodiments of a plasma deposition apparatus. Wherever possible, the same reference numbers are used in the drawing and the description to refer the same or like parts.

FIG. 1a is a cross section showing a first embodiment of a plasma deposition apparatus 100. The plasma deposition apparatus 100 comprises a chamber 110, a pedestal 3, a plasma generator 120 and a gas-extracting apparatus 130. The chamber 110 provides an environment for plasma thin film deposition, and the pressure of the chamber 110 may be the same as the environmental atmosphere (760 torr). The pedestal 3 is placed in the chamber 110. An object such as a substrate 21 is loaded on the pedestal 3. The plasma generator 120, comprising a plasma jet 122, is placed in the chamber 110 over the pedestal 3. A carrier gas such as $N_2$, He, Ar or air and a precursor such as tetraethoxysilane (TEOS), hexamethyldisiloxane (HMDSO), hexamethyldisilazane (HMDSN), tetramethyldisiloxane (TMDSO), silane ($SiH_4$) or tetrafluoromethane ($CF_4$) are introduced and mixed in the plasma jet 122 to generate a plasma beam 20 for the thin film deposition process. A thin film 22 is deposited on the substrate 21 using the plasma beam 20 at an angle $\theta_1$ between a normal direction of the pedestal 3 and the plasma beam 20. The angle $\theta_1$ is larger than about 0° and less than about 90°, preferably about 30° to 60°, more preferably about 40° to 50°. That is, the plasma beam 20 is discharged to the substrate 20 with an incident angle $\theta_1$, and the tilted plasma beam 20 forms a functional thin film 22 such as silicon dioxide ($SiO_2$) or silicon nitride ($SiN_x$) on the substrate 21. An gas-extracting apparatus 130 is placed in the chamber 110 and over the pedestal 3, wherein the gas-extracting apparatus 130 comprises an gas-extracting pipe 132 providing a pumping path 29 for particles and side-products 30 pumping angle $\theta_2$ between the normal direction of the pedestal 3 and a pumping direction 29 of the gas-extracting pipe 132. The angle $\theta_2$ is larger than about 0° and less than about 90°, preferably about 30° to 60°, more preferably about 40° to 50°. The gas-extracting apparatus 130 provides a pumping path 29 for pumping particles or side-products 30. Thus the particles or side-products 30 will not accumulate on the film surface and substrate contamination is prevented. The substrate contamination results in the worse average roughness (Ra) of the thin film 22 or weak adhesion between the thin film 22 and the substrate 21. The difference between $\theta_1$ and $\theta_2$ is preferably less than 20°, more preferably less than 5°, and most preferably 0°. Preferably the tilted plasma beam 20 can prevent hilly or pin-like film surface defects, thereby maintaining film flatness. The particles or side-products 30 generated by the tilted plasma beam 20 bounce away from the substrate 21 to be exhausted by the gas-extracting pipe 132 which is located in the reflective direction (pumping path 29). Thus, poor film quality resulting from particles or side-products generated in the conventional AP PECVD process can be eliminated.

Figure 1B:
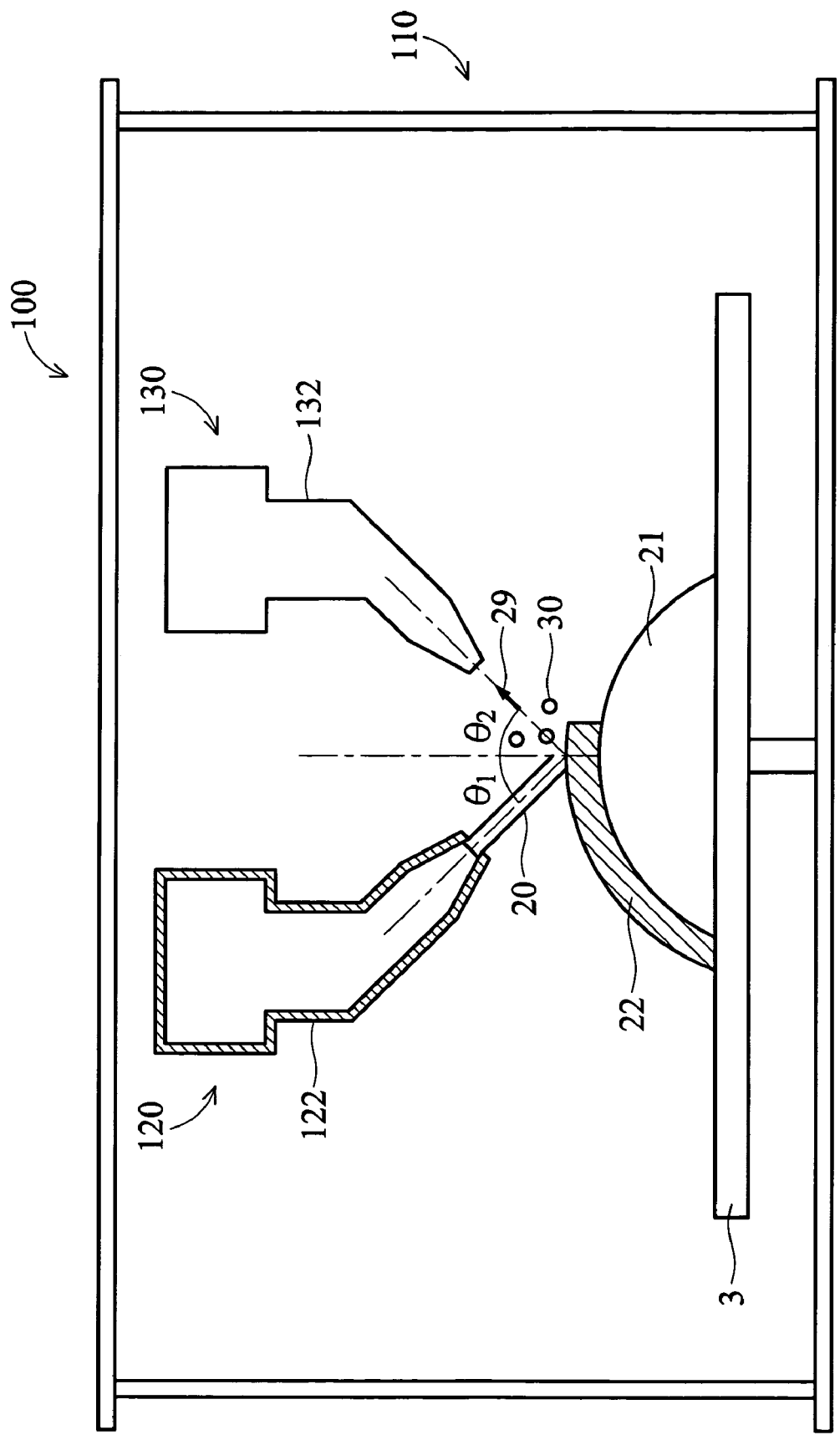
FIG. 1b is a cross section showing a second embodiment of a plasma deposition apparatus.
Figure 1C:
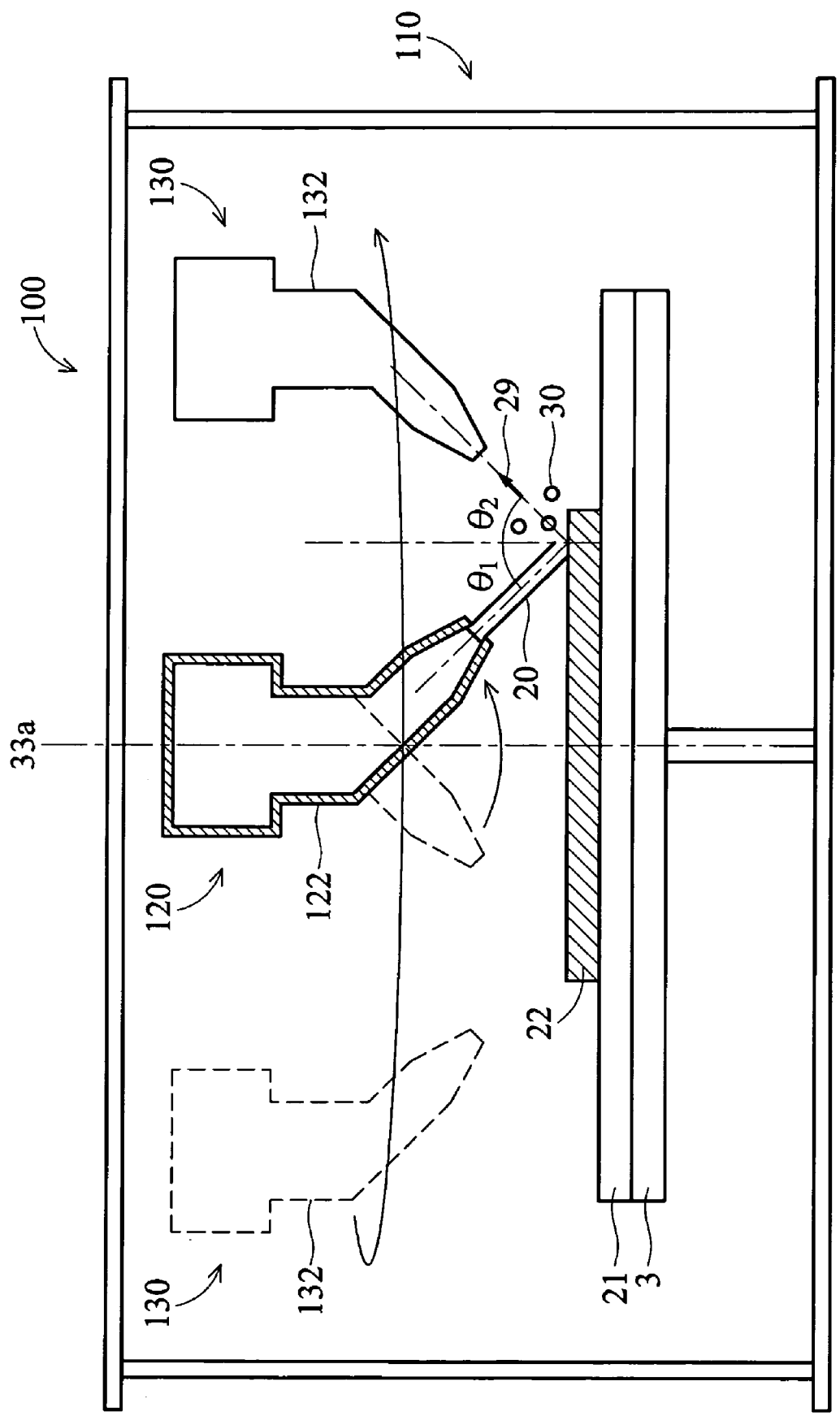
FIG. 1c is a cross section showing a third embodiment of a plasma deposition apparatus.
Figure 1D:
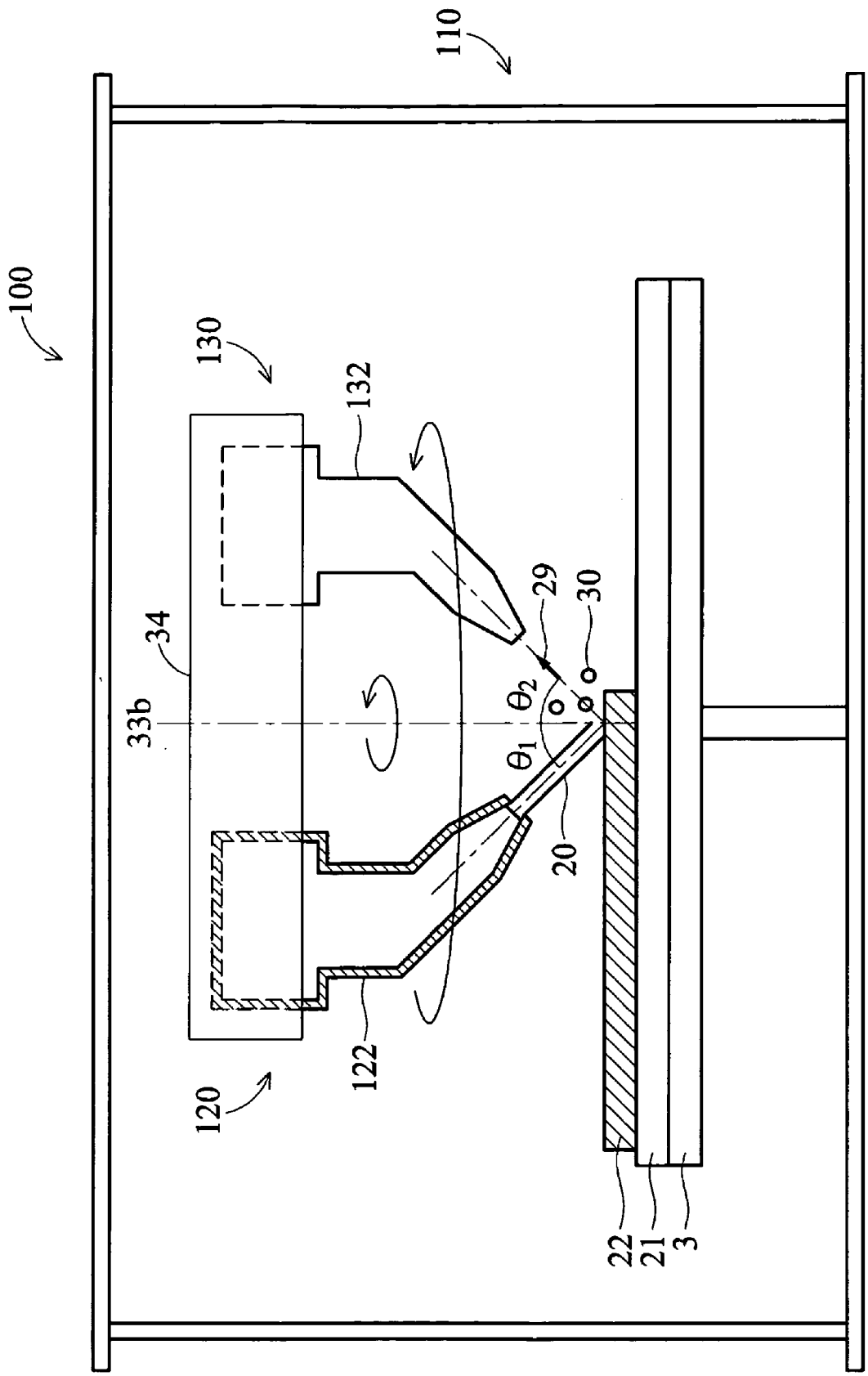
FIG. 1d is a cross section showing a fourth embodiment of a plasma deposition apparatus.
Figure 1E:
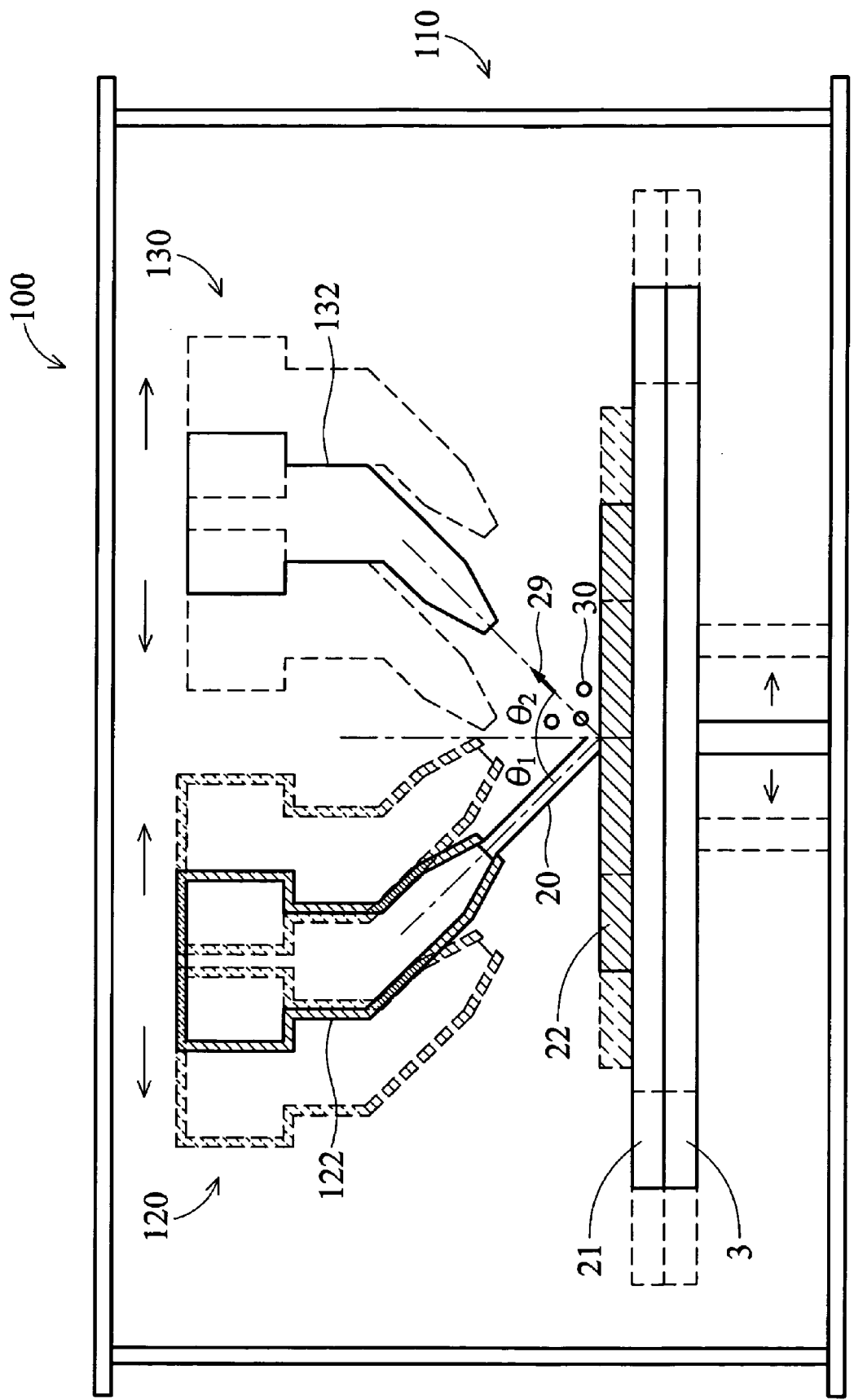
FIG. 1e is a cross section showing a fifth embodiment of a plasma deposition apparatus.
Figure 1F:
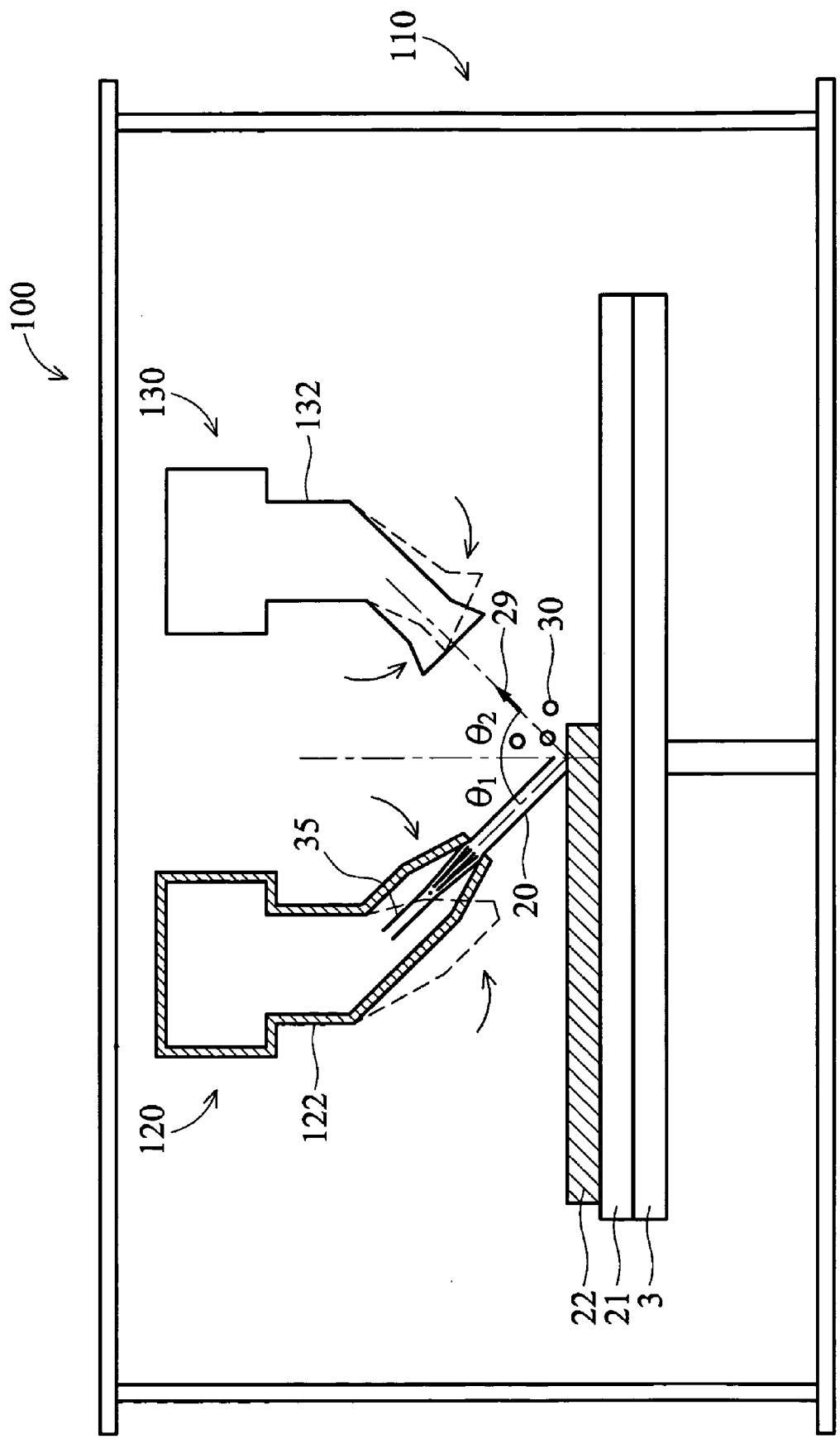
FIG. 1f is a cross section showing a sixth embodiment of a plasma deposition apparatus.
Figure 1G:
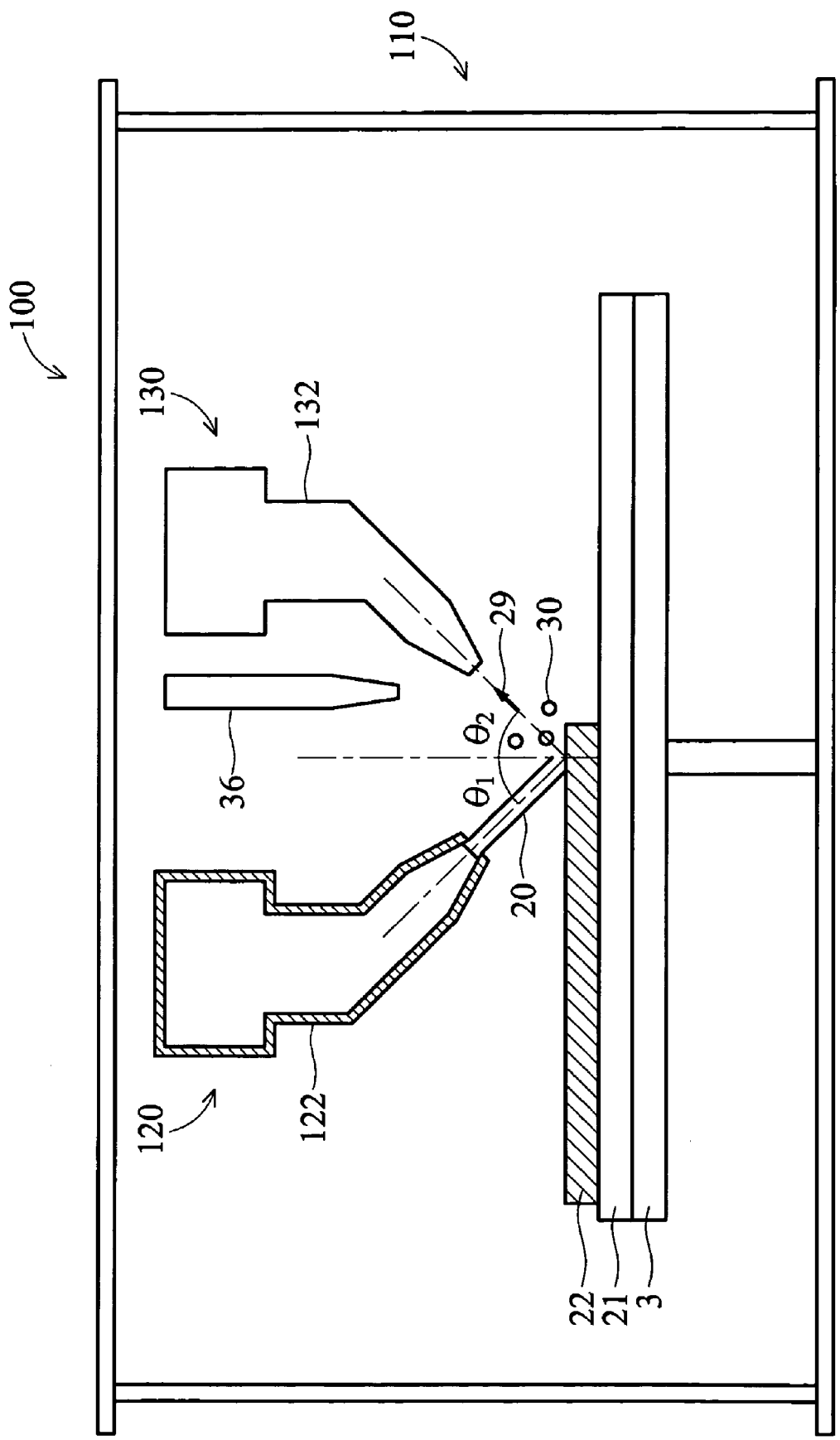
FIG. 1g is a cross section showing a seventh embodiment of a plasma deposition apparatus.

Preferably, the material or the shape of the substrate 21 is not limited. Non-planar substrates, such as bowl-like substrate 21 as shown in FIG. 1b. The plasma deposition apparatus 100 can also form the thin film 22 on the substrate 21. For the thin film 22 can be formed on the substrate 21 completely, the gas-extracting apparatus 130 may rotate around the plasma generator 120 as a rotational axis 33a as shown in FIG. 1c. As shown in FIG. 1d, the gas-extracting apparatus 130 and the plasma generator 120 are combined with a shell 34 and rotated around a rotational axis 33b by a power resource such as a motor. For the thin film 22 can be formed on the substrate 21 uniformly, the gas-extracting apparatus 130 and the plasma generator 120 have a moving direction parallel to pedestal 3 as shown in FIG. 1e. As shown in FIG. 1f, the angle $\theta_1$ can be arbitrarily adjusted. Also, a varied jet path 35 can be arranged in the end of the plasma jet 122 to discharge the plasma jet 122 with a varied incident angle $\theta_1$. The angle $\theta_2$ between the normal direction of the pedestal 3 and a pumping direction 29 of the gas-extracting pipe 132 can be arbitrarily adjusted to correspond to the angle $\theta_1$. The end of the gas-extracting pipe 132 can be a wide-mouth shape for pumping off as many particles or side-products 30 as possible. As shown in FIG. 1g, the plasma deposition apparatus 100 further comprises a detector 36 placed above the pedestal 3 between the gas-extracting apparatus 130 and the plasma generator 120. The detector 36 can be a product analyzer or a particle tracker for analyzing the composition of the thin film 22 or tracing the reflective direction of the particles or side-products 30.

Figure 2:
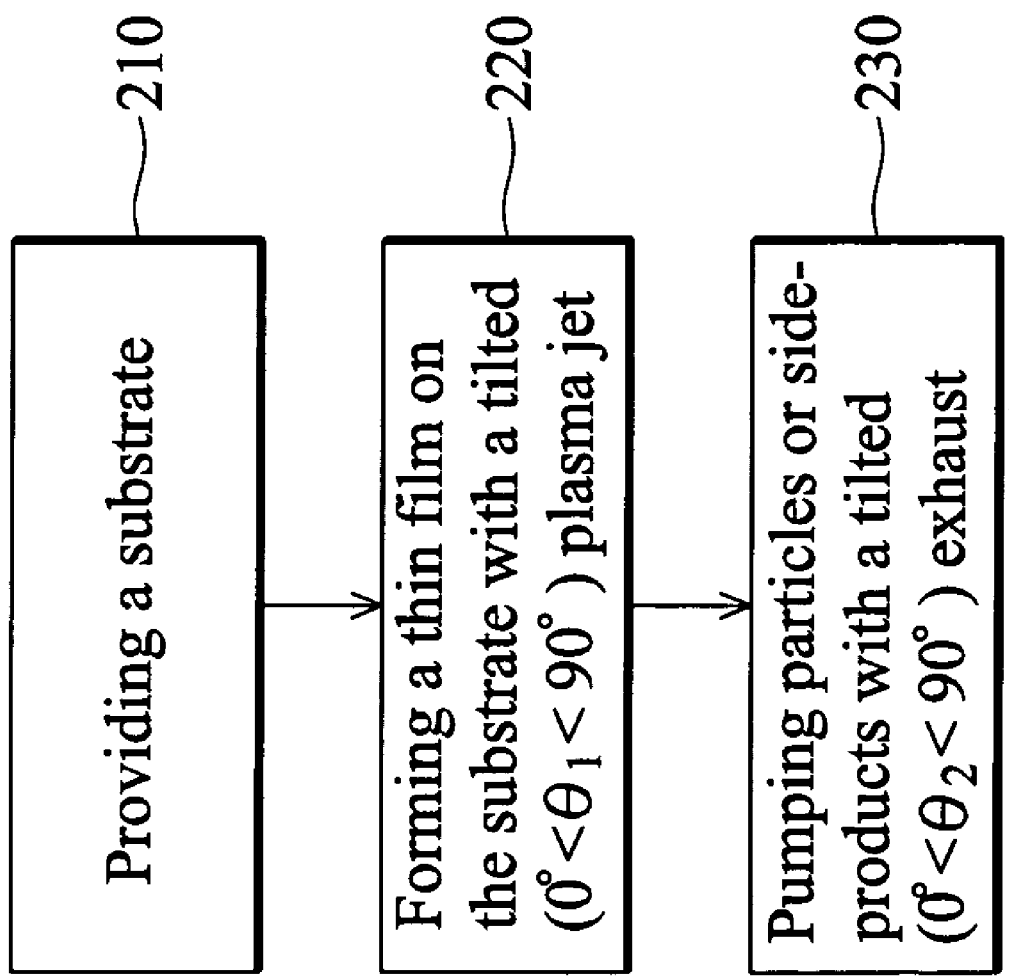
FIG. 2 is a process chart of an embodiment of a plasma thin film deposition method.

FIG. 2 is a process chart of an embodiment of a plasma thin film deposition method. As shown in step 210, the plasma thin film deposition step comprises providing a substrate. As shown in step 220, a thin film, is formed with uniform flatness on the substrate by a tilted plasma jet. Thus, poor film flatness, due to hilly or pin-like surface defects, is prevented. The plasma jet has a discharge direction angle $\theta_1$ larder than 0° and less than 90° between a normal direction of the substrate and the discharge direction of the plasma jet. As shown in step 230, particles or side-products are pumped with a tilted gas-extracting apparatus, wherein the gas-extracting apparatus comprises an gas-extracting pipe having a pumping direction angle $\theta_2$ larder than 0° and less than 90° between the normal direction of the substrate and the pumping direction of the gas-extracting pipe.

Figure 3A:
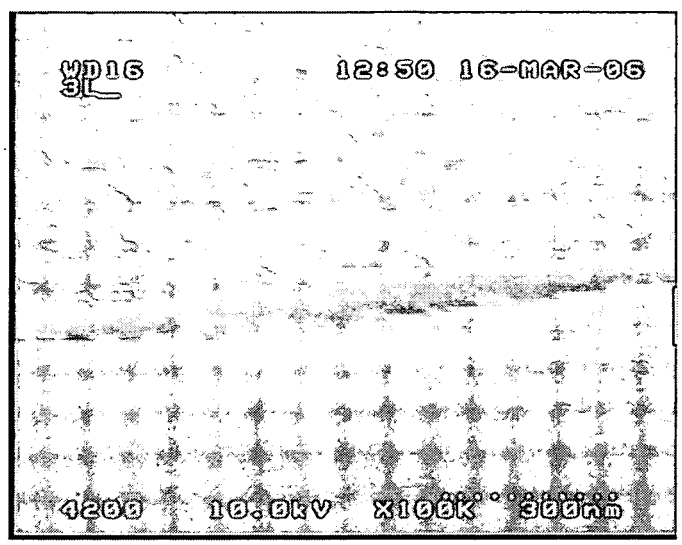
FIG. 3a shows the SEM image and the average roughness (Ra) of the conventional atmospheric pressure plasma deposition apparatus.
Figure 3B:
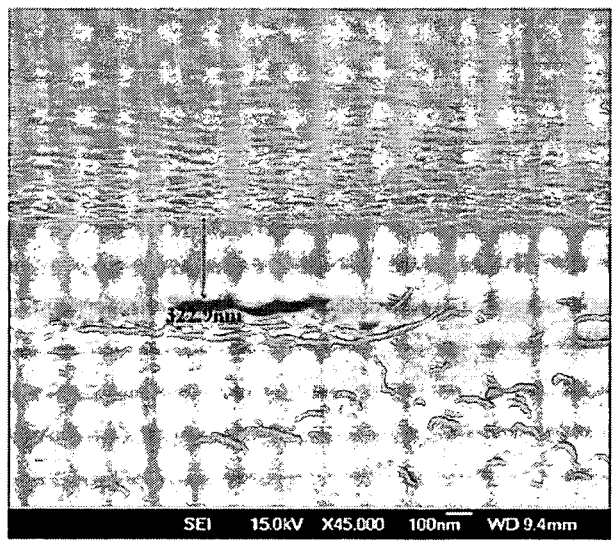
FIG. 3b shows the SEM image and the average roughness (Ra) of an embodiment of a plasma deposition apparatus.

Surface average roughness (Ra) analysis of the conventional atmosphere plasma deposition apparatus ($\theta_1=0°$, with gas-extracting pipe) and the plasma deposition apparatus 100 is utilized to determine film quality. The larger determined surface Ra indicates lower film quality or film transmittance. FIGS. 3a and 3b show the scanning electron microscope (SEM) image and the surface average roughness (Ra) of the silicon dioxide ($SiO_2$) films deposited by the conventional atmospheric pressure plasma deposition apparatus and the plasma deposition apparatus 100. The determined surface Ra of the $SiO_2$ film deposited by the conventional atmospheric pressure plasma deposition apparatus is about 0.6 μm. The determined surface Ra of the $SiO_2$ film formed by the plasma deposition apparatus 100 is about 0.02 μm. Compared with the conventional atmospheric pressure plasma deposition apparatus, the $SiO_2$ film deposited by the plasma deposition apparatus 100 shows a lower determined surface Ra, and thus, better transmittance, and film quality.

The plasma deposition apparatus of the invention can be employed in an atmospheric pressure plasma deposition process. A thin film with lower surface Ra, better transmittance and adhesion can be formed using a tilted plasma generator and a corresponding gas-extracting system. By eliminating the need for a vacuum system the simplified fabrication, low cost, and of the plasma deposition apparatus of the invention is offers clear advantages over the conventional technology.

The plasma deposition apparatus of the invention can be also employed in low pressure plasma deposition processes or surface treatments, but is not limited to the atmospheric pressure plasma deposition process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A plasma thin film deposition method performed in a chamber, comprising:
   providing a substrate;
   generating a plasma beam for thin film deposition to form a thin film on the substrate using a plasma generator, wherein the plasma generator comprises a plasma jet having a discharge direction angle $\theta_1$ larger than 0° and less than 90° between a normal direction of the substrate and the discharge direction of the plasma jet; and
   pumping to remove particles or side-products from the chamber by a gas-extracting pipe extending into the chamber, wherein the gas-extracting pipe has a pumping direction angle $\theta_2$ larger than 0° and less than 90° between the normal direction of the substrate and the pumping direction of the gas-extracting pipe, and wherein the chamber is kept at an ambient atmospheric pressure.

2. The plasma thin film deposition method as claimed in claim 1, wherein $\theta_1$ is equal to $\theta_2$.

3. The plasma thin film deposition method as claimed in claim 1, wherein the difference between $\theta_1$ and $\theta_2$ is less than 20.

4. The plasma thin film deposition method as claimed in claim 1, further comprising a detector placed above the substrate and between the gas-extracting apparatus and the plasma generator.

5. The plasma thin film deposition method as claimed in claim 1, wherein the detector is a product analyzer.

6. The plasma thin film deposition method as claimed in claim 1, wherein the detector is a particle tracker.

7. The plasma thin film deposition method as claimed in claim 1, wherein the thin film is formed by plasma-enhanced chemical vapor deposition (PECVD).

8. The plasma thin film deposition method as claimed in claim 1, wherein the thin film is a silicon dioxide film or a silicon nitride film.

9. The plasma thin film deposition method as claimed in claim 1, wherein the thin film is an inorganic thin film.

* * * * *